(12) United States Patent
Meiser et al.

(10) Patent No.: US 9,054,181 B2
(45) Date of Patent: Jun. 9, 2015

(54) SEMICONDUCTOR DEVICE, INTEGRATED CIRCUIT AND METHOD OF MANUFACTURING A SEMICONDUCTOR DEVICE

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 13/828,894

(22) Filed: Mar. 14, 2013

(65) Prior Publication Data

US 2014/0264580 A1 Sep. 18, 2014

(51) Int. Cl.
| | |
|---|---|
| *H01L 27/01* | (2006.01) |
| *H01L 27/12* | (2006.01) |
| *H01L 31/0392* | (2006.01) |
| *H01L 29/78* | (2006.01) |
| *H01L 29/10* | (2006.01) |
| *H01L 29/66* | (2006.01) |

(52) U.S. Cl.
CPC ........ *H01L 29/7816* (2013.01); *H01L 29/1095* (2013.01); *H01L 29/66681* (2013.01)

(58) Field of Classification Search
USPC ......... 257/347, 607, 288, 272, 192, 335, 336, 257/387, 391, 213, 760, 744, 745, E21.006, 257/E21.051, E21.055, E21.092, E21.121, 257/E21.207, E21.246, E21.267, E21.278, 257/E21.293, E21.315, E21.32, E21.435
See application file for complete search history.

(56) References Cited

U.S. PATENT DOCUMENTS

| | | | |
|---|---|---|---|
| 7,880,224 B2 * | 2/2011 | Werner et al. | 257/329 |
| 8,541,823 B2 * | 9/2013 | Furukawa et al. | 257/288 |
| 8,643,086 B2 * | 2/2014 | Pfirsch et al. | 257/328 |
| 8,674,727 B2 * | 3/2014 | Mauder et al. | 327/108 |

FOREIGN PATENT DOCUMENTS

| | | |
|---|---|---|
| DE | 102006009942 A1 | 9/2007 |
| WO | 2007012490 A2 | 2/2007 |

* cited by examiner

*Primary Examiner* — David Nhu
(74) *Attorney, Agent, or Firm* — Murphy, Bilak & Homiller, PLLC

(57) ABSTRACT

A semiconductor device includes a transistor. The transistor includes a source region, a drain region, a body region, a drift zone, and a gate electrode being adjacent to the body region. The body region, the drift zone, the source region and the drain region are disposed in a first semiconductor layer having a first main surface. The body region and the drift zone are disposed along a first direction between the source region and the drain region, the first direction being parallel to the first main surface. The transistor further includes a drift control region arranged adjacent to the drift zone, the drift control region being disposed over the first main surface.

24 Claims, 10 Drawing Sheets

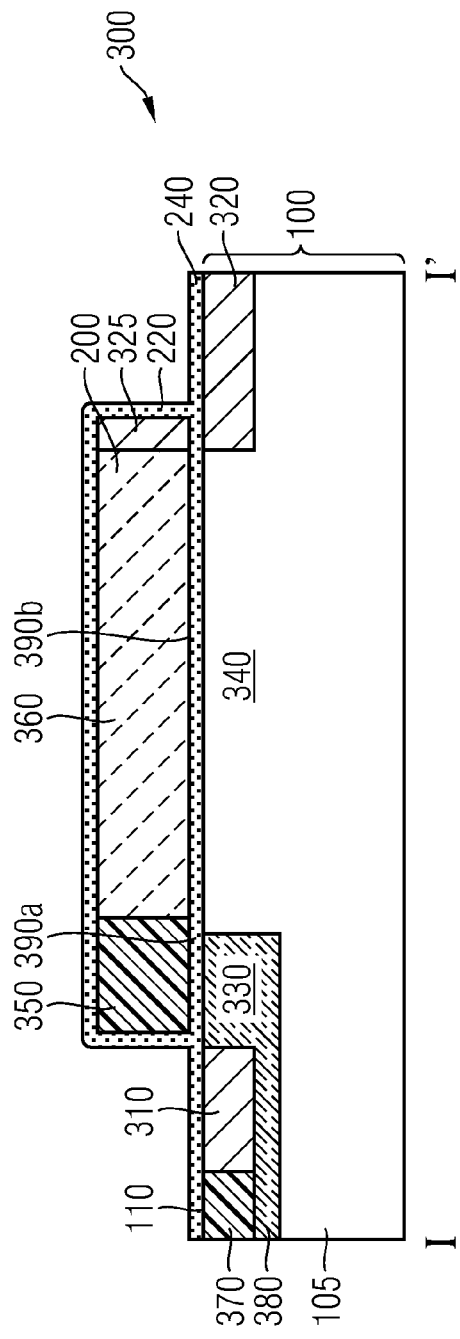
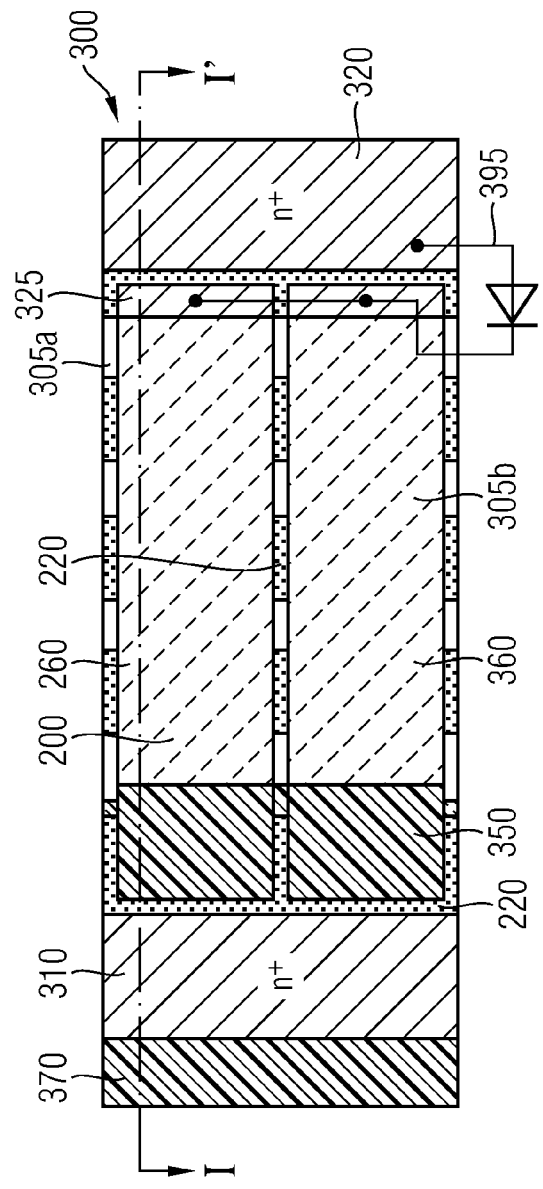
FIG 1A
FIG 1B

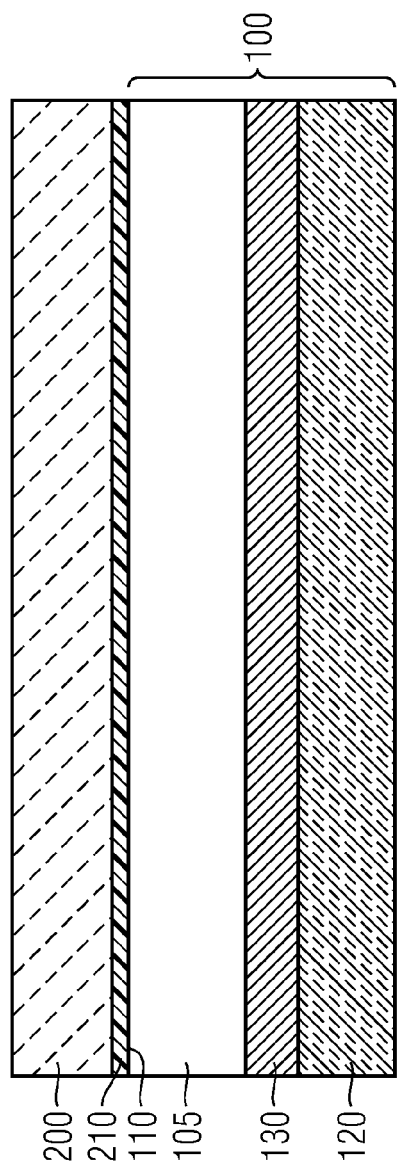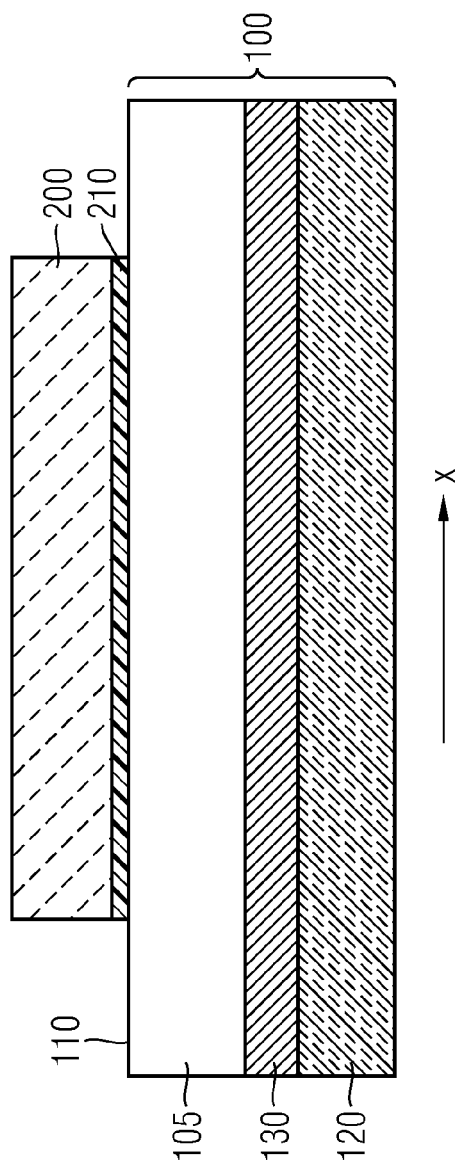

SEMICONDUCTOR DEVICE, INTEGRATED CIRCUIT AND METHOD OF MANUFACTURING A SEMICONDUCTOR DEVICE

TECHNICAL FIELD

The present disclosure relates to a semiconductor device, an integrated circuit and a method of manufacturing a semiconductor device.

RELATED BACKGROUND

MOS (metal oxide semiconductor) power transistors or MOS power devices which are commonly employed in automotive and industrial electronics, should have a low switch-on resistance ($R_{on}$), when being switched on. In a switch-off state, they should have a high breakdown voltage characteristic and withstand high source-drain voltages. For example, a MOS power transistor should withstand a drain to source voltage $V_{ds}$ in the order of tens or hundreds or thousands of volts when being switched off. As a further example, MOS power transistors conduct very large current which may be in the order of hundreds of Amperes at a gate-source voltage of about 2 to 20 V at a low voltage drop $V_{ds}$.

Lateral MOS power devices, in which the current flow mainly takes place parallel to a first main surface of a semiconductor substrate, are commonly used. For example, lateral power devices are useful for integrated devices in which further components, such as switches, bridges and control circuits are integrated.

So-called TEDFETs have been developed in order to accomplish a power device having an increased on-current and a high breakdown voltage characteristic. TEDFETs specifically rely on the effect of accumulation in the drift region of a MOS power transistor.

In view of the above, there is a need of developing a lateral MOS power transistor which can be manufactured by a simple and cheap process.

SUMMARY OF THE INVENTION

According to an embodiment, a semiconductor device comprises a transistor. The transistor includes a source region, a drain region, a body region, a drift zone, and a gate electrode being adjacent to the body region. The body region, the drift zone, the source region and the drain region are disposed in a first semiconductor layer having a first main surface. The body region and the drift zone are disposed along a first direction between the source region and the drain region. The first direction being parallel to the first main surface. The transistor further comprises a drift control region that is arranged adjacent to the drift zone. The drift control region is disposed over the first main surface.

According to an embodiment, a semiconductor device comprises a plurality of transistor cells. Each of the transistor cells includes a source region, a drain region, a body region, a drift zone, and a gate electrode being adjacent to the body region. The body region, the drift zone, the source region and the drain region are disposed in a first semiconductor layer having a first main surface. The body region and the drift zone are disposed along a first direction between the source region and the drain region. The first direction is parallel to the first main surface. Each of the transistor cells further comprises a drift control region that is arranged adjacent to the drift zone. The gate electrode and the drift control region are disposed in sections of a second semiconductor layer. The second semiconductor layer is disposed over the first semiconductor layer, and portions of an insulating layer are disposed between adjacent sections of the second semiconductor layer.

According to an embodiment, a method of manufacturing a semiconductor device comprising a transistor includes forming a source region in a first semiconductor layer having a first main surface, forming a drain region in the first semiconductor layer, forming a body region in the first semiconductor layer, forming a drift zone in the first semiconductor layer, and forming a gate electrode so as to be adjacent to the body region. Forming the body region and the drift zone is accomplished so that the body region and the drift zone are disposed along a first direction between the source region and the drain region, the first direction being parallel to the first main surface. The method further comprises forming a drift control region so as to be arranged adjacent to the drift zone. The drift control region is formed so as to be disposed above the first main surface.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 1A to 1C illustrate various views of a semiconductor device according to a first embodiment;

FIGS. 3A to 3K illustrate a method of manufacturing a semiconductor device;

DETAILED DESCRIPTION

Figure 1C:
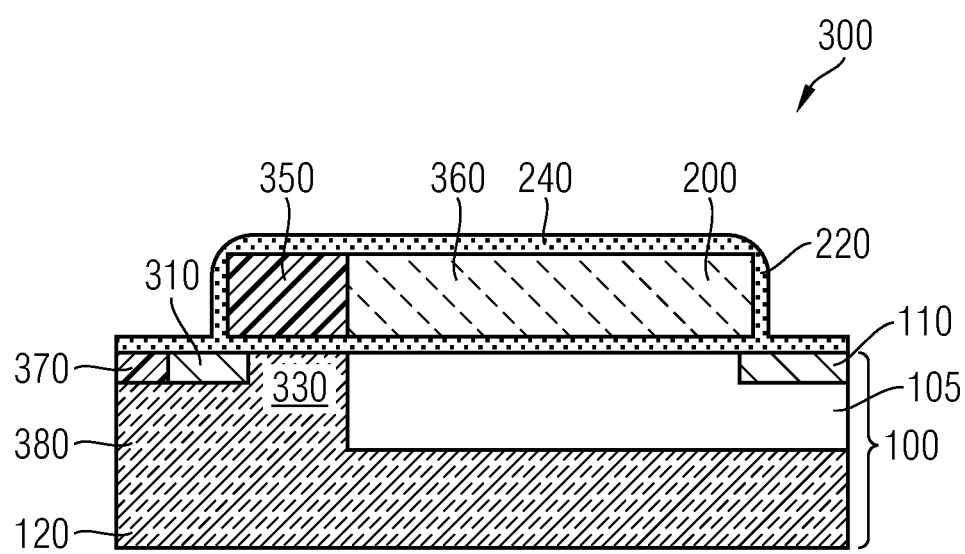

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOD, silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIGS. 1A to 1C illustrate various views of a semiconductor device according to an embodiment.

FIG. 1A illustrates a cross-sectional view of a semiconductor device 300, the cross-sectional view being taken between I and I' as is also illustrated in FIG. 1B. Components of the semiconductor device 300 shown in FIG. 1A are formed in a first semiconductor layer 105. The first semiconductor layer 105 forms part of a first semiconductor carrier which may comprise further layers. For example, the first semiconductor carrier 100 may be a n- or p-doped semiconductor substrate including p- or n-doped regions. According to a further embodiment, the first semiconductor carrier 100 may be an SOI (silicon on insulator) substrate comprising a buried oxide layer which is disposed between semiconductor layers. According to an embodiment, the first semiconductor carrier 100 may comprise a first semiconductor layer which may be n-doped.

In the embodiment of FIG. 1A, a source region 310, a drain region 320, a body region 330 and a drift region 340 are disposed in the first semiconductor layer 105. In particular, the body region 330 and the drift region 340 are disposed along a first direction between the source region 310 and the drain region 320. The first direction is parallel to the first main surface 110 of the first layer 105. A second semiconductor layer 200 is disposed over a first surface 110 of the first semiconductor layer 105. The gate electrode 350 and the drift control region 360 are disposed in the second semiconductor layer 200. The gate electrode 350 is disposed adjacent to the body region 330, the gate electrode being insulated from the body region 330 by means of a gate dielectric 390 which may, for example, comprise silicon oxide as is conventional. The drift control region is disposed adjacent to the drift region 340, the drift control region being insulated from the drift region 340 by means of a dielectric layer 390b. For example, the gate dielectric 390a and the dielectric layer 390b between the drift control region and the drift region 340 may be portions of a single layer that is disposed between the first and the second semiconductor layer. For example, the dielectric layer 390b between the drift control region 360 and the drift region 340 and the gate dielectric 390a have the same thickness and composition. An insulating layer 240 is disposed on a surface 110 of the first semiconductor layer 105. An insulating spacer 220 is disposed adjacent to sidewalls of the second semiconductor layer 200.

In the embodiment shown in FIG. 1A, the gate electrode 350 and the drift control region 360 are disposed over the main surface 110 of the first semiconductor layer 105. The semiconductor device of FIG. 1A may further comprise a body contact 370 which is connected with the body region 330 via a body contact path 380. Due to the presence of the body contact 370 a parasitic bipolar transistor can be prevented from being formed when an off-voltage is applied to the gate electrode 350 of the device.

In the embodiment of FIG. 1A, the drift control region 360 is doped with dopants of the first conductivity type, and the gate electrode is doped with dopants of the second conductivity type. The source and the drain regions 310, 320 are doped with the first conductivity type, and the body region 330 is doped with the second conductivity type. The drift region 340 is doped with the first conductivity type. For example, the first semiconductor layer 105 may be lightly n-doped, and the body region 330 is p-doped. The source and the drain regions 310, 320 are heavily n-doped. The gate electrode may be heavily p$^+$-doped and the drift control region 360 may be lightly n-doped.

According to an embodiment, the drift control region 360 may be lightly doped, being doped with the conductivity type of the drain region. The drift control region may have the same doping concentration or a lower doping concentration than the drift region 340. According to still a further embodiment, the drift control region 360 may be undoped.

In the embodiment shown in FIG. 1A, the drift control region 360 and the gate electrode 350 are in contact with each other. Since they are complementarily doped, they form a pn junction.

A portion of the drift control region 325 adjacent to the drain region 320 is heavily doped to form the drain contact doped portion 325. A gate dielectric layer 390a, for example, silicon oxide is disposed between the gate electrode 350 and the body region 330. Further, a dielectric layer 390b, for example, silicon oxide, is disposed between the drift control region 360 and the drift region 340. For example, a thickness of the gate dielectric layer 390a may be approximately equal to a thickness of the dielectric layer 390b between the drift control region 360 and the drift region 340.

The drift control region 360 is connected with the drain region 320 by means of a diode (not shown in this Figure) having a forward conducting direction from the drain region to the drift control region via the drain contact doped portion 325. For example, this may be accomplished by a p-doped region (not shown in FIG. 1a) in contact with the drain contact doped portion 325. The drain region 320 may be connected with the p-doped region of the diode by means of an ohmic contact. Since a pn junction having a forward direction from the gate electrode to the drift control region is formed between the gate electrode 350 and the drift control region 360, it is possible to hold the drift control region 360 at a higher voltage than the gate electrode 350.

As is further shown in FIG. 1A, the second semiconductor layer has a smaller length measured along the first direction than the length of the first layer 105 measured in the first direction. In FIG. 1A, the drift control region approximately extends along the whole length of the drift region 340 measured along the first direction. According to a further embodiment, the drift control region 360 may extend over the whole lateral extension of the drift region 340. Further, the combined length of the gate electrode 350, the drift control region 360 and the drain contact doped portion 325 is larger than the length of the drift region 340. The combined length of these regions corresponds to the length of the second semiconductor layer. The length of the second semiconductor layer approximately corresponds to the distance between the source region and the drain region 320.

If an on-voltage is applied to the gate electrode, an inversion layer and, consequently, a conductive channel is formed at the boundary between the body region 330 and the gate dielectric 390a. Further, since the drift control region 360 is connected with the gate electrode 350 and the drain region 320, the drift control region 360 is held at a higher potential than or at an equal potential as the gate electrode 350. In this case, an accumulation layer is formed in the drift region 340 at a boundary to the dielectric layer 390b. Due to the complementary doping type of the drift region 340 in comparison to the body region 330, an accumulation layer is formed at the boundary to the dielectric layer 390b. Accordingly, the transistor is in a conducting state from the source region 310 to the drain region 320 via the conductive channel formed in the body region 330 and the accumulation region formed in the drift region 340. In the accumulation region, the number of carriers is increased in comparison to a case in which no field effect is exhibited. As a consequence, the conductivity of the drift region is increased. Due to the increased conductivity, the doping concentration of the drift region may be reduced, thereby improving the breakdown voltage.

In case of switching-off, no conductive channel is formed in the body region 330 at the boundary to the gate electric layer 390a. Further, a depletion zone is formed at the boundary between the drift region 340 and the dielectric layer 390b. Accordingly, charge carriers are removed from the drift region 340, resulting in a blocking of the current flow at a high breakdown voltage.

As has been explained above, the concept of the drift control region is different from that of a field plate. As has been further mentioned, the thickness of the dielectric layer 390b between the drift region and the drift control region may be approximately equal to the thickness of the gate dielectric layer 390a.

According to an embodiment, the second semiconductor layer comprises monocrystalline semiconductor material. In particular, the drift control region 360 may comprise monocrystalline semiconductor material. As a consequence, the material of the drift control region 360 has no grain boundaries. Due to the absence of grain boundaries, the specific conductivity mechanisms necessary for effectively forming the accumulation layer and the depletion zone in case a corresponding voltage is applied to the drift control region are accomplished. Hence, good breakdown voltage characteristics are obtained and leakage currents between the gate electrode 350 and the drift control region 360 are suppressed. Further, the drift control region may be effectively depleted by applying an off-voltage between the gate electrode 350 and the drain region 320.

FIG. 1B shows a plan view of a semiconductor device according to an embodiment. FIG. 1B shows a source region 310, and a drain region 320 as well as a gate electrode 350 and a drift control region 360. The body contact 370 is disposed in a stripe-like manner adjacent to the source region 310. According to the embodiment of FIG. 1B, the gate electrode 350 is in contact with and electrically coupled to the drift control region 360. The second semiconductor layer 200 is divided into sections, each of the sections extending along the first direction and being surrounded by portions of an insulating layer 220. Further, an insulating spacer 220 is disposed adjacent to the sidewalls of the sections of the second semiconductor layer. FIG. 1B further shows the diode 395 that is disposed between the drain region 320 and the drain contact doped portion 325 that is formed in the second semiconductor layer 200.

The semiconductor device shown in FIGS. 1A and 1B comprises a plurality of transistor cells 305a, 305b. Each of the transistor cells 305a, 305b comprises a source region 310, a drain region 320, a body region 330, a drift zone 340 and a gate electrode 350 that is adjacent to the body region 330. The body region 330, the drift zone 340, the source region 310 and the drain region 320 are disposed in a first semiconductor layer 105 having a first main surface 110. The body region 330 and the drift zone 340 are disposed along a first direction between the source region 310 and the drain region 320. The first direction is parallel to the first main surface 110. The transistor cells 305a, 305b implement lateral transistors. A current flow in a lateral transistor mainly has a component in a direction parallel to the first main surface of the substrate. The current flow in the direction parallel to the first main surface is controlled by means of the gate electrode 350. Each of the transistor cells 305a, 305b further comprise a drift control region 360 arranged adjacent to the drift zone 340. The gate electrode 350 and the drift control region 360 are disposed in sections of second semiconductor layer 200, the second semiconductor layer 200 being disposed over the first semiconductor layer 105. Portions of an insulating layer 220 are disposed between adjacent sections 260 of the second semiconductor layer 200.

FIG. 1C shows a modification of the embodiment illustrated in FIG. 1A. In the embodiment of FIG. 1C, the semiconductor carrier 100 comprises a first semiconductor layer 105 having reduced thickness in comparison to the first semiconductor layer shown in FIG. 1A. The semiconductor carrier further comprises a second doped region 120 that may be, for example, p-doped. Generally speaking, the second doped region 120 has the same conductivity type as the body region 330 which is different from a conductivity type of the first semiconductor layer. According to the embodiment shown in FIG. 1C, the body contact path 380 merges with the second doped region 120 so that beneath the gate electrode 350 only the semiconductor material of the conductivity type of the body region is present.

According to the embodiment of FIGS. 1A to 1C, the gate electrode is disposed so as to be in contact with and to be electrically coupled to the drift control region 360.

Figure 2A:
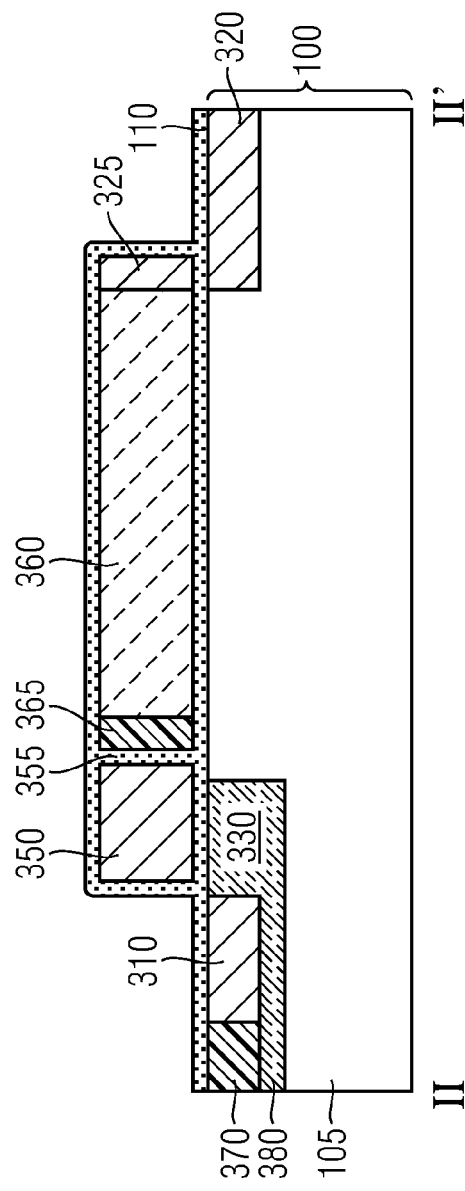
FIGS. 2A and 2B illustrate views of a semiconductor device according to a further embodiment.
Figure 2B:
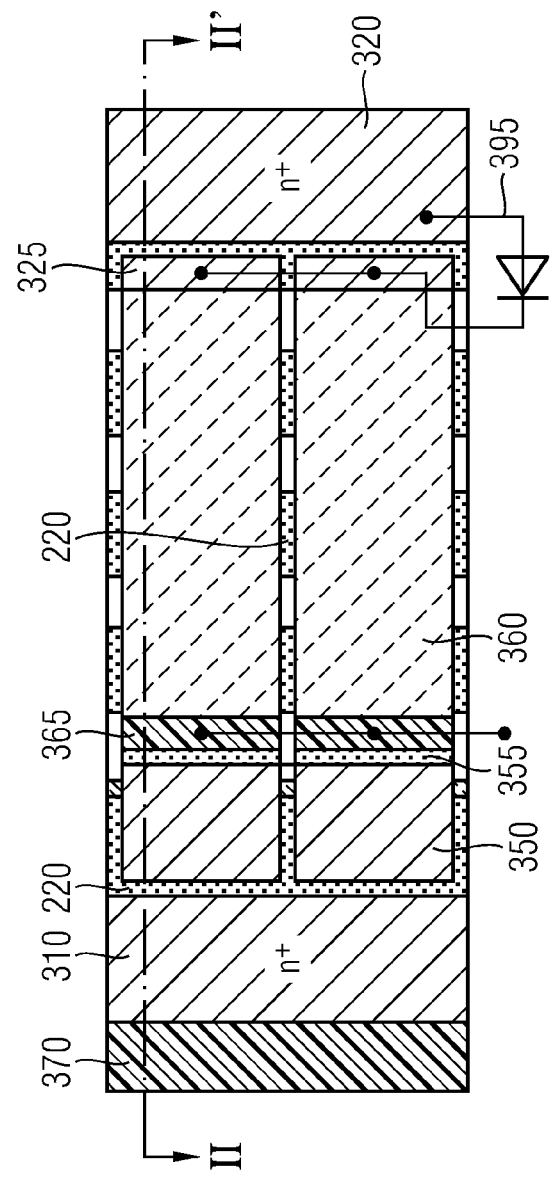

According to the embodiment of FIGS. 2A and 2B, a dielectric layer 355 may be disposed between the gate electrode 350 and the drift control region 360.

FIG. 2A shows a cross-sectional view of a semiconductor device according to this embodiment. The cross-sectional view of FIG. 2A is taken between II and II' as is also illustrated in FIG. 2B.

The semiconductor device of FIGS. 2A and 2B comprises approximately the same components as the embodiment of FIGS. 1A and 1B. However, in contrast to the embodiment of FIGS. 1A and 1B, according to the embodiment of FIG. 2A, the gate electrode 350 is of the first conductivity type, for example, n-doped. Further, a dielectric layer 355 is disposed between the gate electrode 350 and the drift control region 360. The drift control region 360 comprises a contact doped portion 365 so as to provide a pn junction. The drift control region 360 may be connected to an external potential via the contact doped portion 365.

FIG. 2B shows a plan view of the structure shown in FIG. 2A. According to the embodiment illustrated in FIGS. 2A and 2B, it is possible to connect the gate electrode 350 and the drift control region 360 with different potentials.

FIGS. 3A to 3K illustrate a method of manufacturing a semiconductor device according to an embodiment. A starting point for manufacturing a semiconductor device according to an embodiment is a semiconductor carrier 100. For example, the semiconductor carrier 100 may comprise different semiconductor regions of different doping types. According to an embodiment, the semiconductor carrier 100 may further comprise a buried oxide layer 130 to form a SOI (silicon-on-insulator) substrate. For example, a first semiconductor layer 105 of a first conductivity type (e.g. n-doped) may be present adjacent to the first main surface 110. Further, a second doped region 120 of the second conductivity type may be disposed at a side opposite to the first main surface 110. According to an embodiment, the first semiconductor layer 105 of the first conductivity type may be epitaxially grown over the second doped region or vice versa. Alternatively, been differently doped regions may be formed by ion implantation. Optionally, a buried oxide layer 130 may be disposed between the first semiconductor layer 105 and the second doped region.

For the sake of convenience, in the next figures, the semiconductor carrier 100 comprising the buried oxide layer 130 will be shown. Nevertheless, as is to be clearly understood, the method may also be implemented using a semiconductor carrier 100 without a buried oxide layer.

Figure 3A:
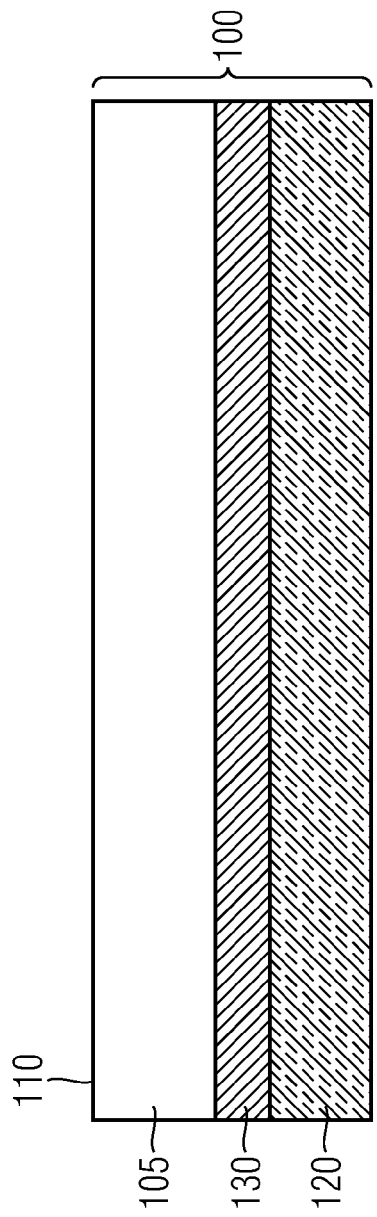

Starting from the structure shown in FIG. 3A, a sacrificial layer 210 is formed over the first surface 110 of the first semiconductor layer 105. The sacrificial layer 210 may be epitaxially grown. For example, the material of the epitaxial layer may be selected so that the information about the crystal structure of the first semiconductor layer 105 is transferred to the sacrificial layer 210. For example, the material of the sacrificial layer 210 should be a similar lattice constant as the material of the first semiconductor layer 105. Further, the sacrificial layer 210 should be configured to be etched selectively with respect to the material of the first semiconductor layer 105. For example, SiGe may be selected as the material of the sacrificial layer 210.

The thickness of the SiGe layer approximately corresponds to the thickness of the gate oxide of the processed semiconductor device. For example, the thickness may be approximately 10 nm to 100 nm. According to a further embodiment, any material that may be epitaxially grown on the first semiconductor layer 105, and on which material a further monocrystalline layer may be epitaxially formed and which material can be selectively removed with respect to the first semiconductor layer 105 and the further monocrystalline semiconductor layer, may be used.

Figure 3B:
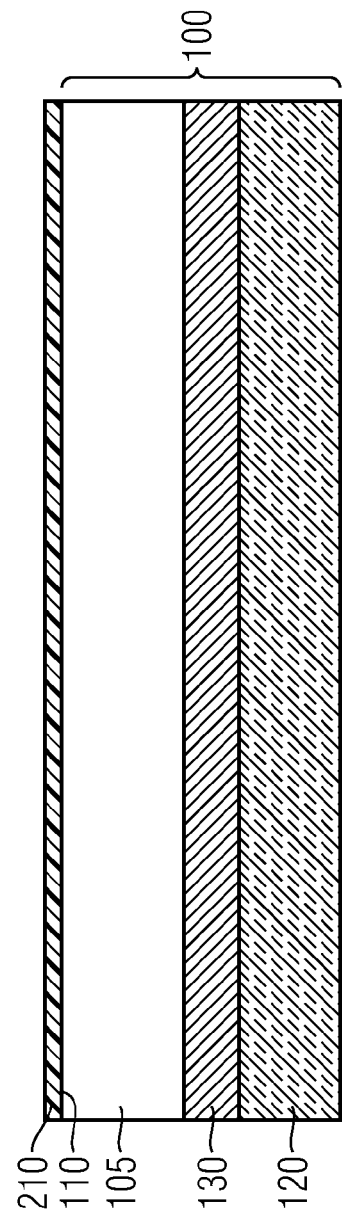

FIG. 3B shows an example of a resulting structure. Thereafter, a further epitaxy method is performed to grow the second semiconductor layer 200. Growing the second semiconductor layer 200 is accomplished so that the crystal structure of the sacrificial layer 210 and, according to an embodiment, of the first semiconductor layer 105 is transferred to the second semiconductor layer 200. According to a further embodiment, the second semiconductor layer 200 may be grown as a monocrystalline layer so that a perfect crystal structure is obtained in the second semiconductor layer, wherein the crystal structure of the second semiconductor layer 200 is different from the crystal structure of the first semiconductor layer 105. For example, the second semiconductor layer 200 is in-situ doped with the first conductivity type. According to a further embodiment, the second semiconductor layer 200 may be doped by implantation. The doping concentration of the second semiconductor layer 200 is higher than that of the first semiconductor layer 105.

FIG. 3C shows an example of a resulting structure. Then, the sacrificial layer 210 and the second semiconductor layer 200 are patterned so that the length of these layers is reduced with respect to the length of the semiconductor carrier 100, the length being measured in the x-direction illustrated in FIG. 3D. For example, this may be accomplished using a hardmask layer for patterning the second semiconductor layer 200. The hardmask layer may, for example, comprise silicon nitride, silicon oxide or a combination thereof. Then, the second semiconductor layer 200 is etched. For example, this may be accomplished by dry etching using, for example, $NF_3$/HBr as etching gases.

FIG. 3D shows an example of a resulting structure. Thereafter, spacers 220 of an insulating material are formed so as to be disposed adjacent to sidewalls of the second semiconductor layer 200. The spacers may be made of silicon oxide or silicon nitride. For example, forming the spacers may be accomplished by conformingly depositing a silicon oxide layer and performing an anisotropic etching step which etches horizontal portions of the silicon oxide layer at a higher etching rate than vertical portions of the silicon oxide layer. As a result, spacers 220 are formed at the sidewalls of the second silicon layer 200. The spacers 220 will stabilize the structure during a following etching step.

Figure 3E:
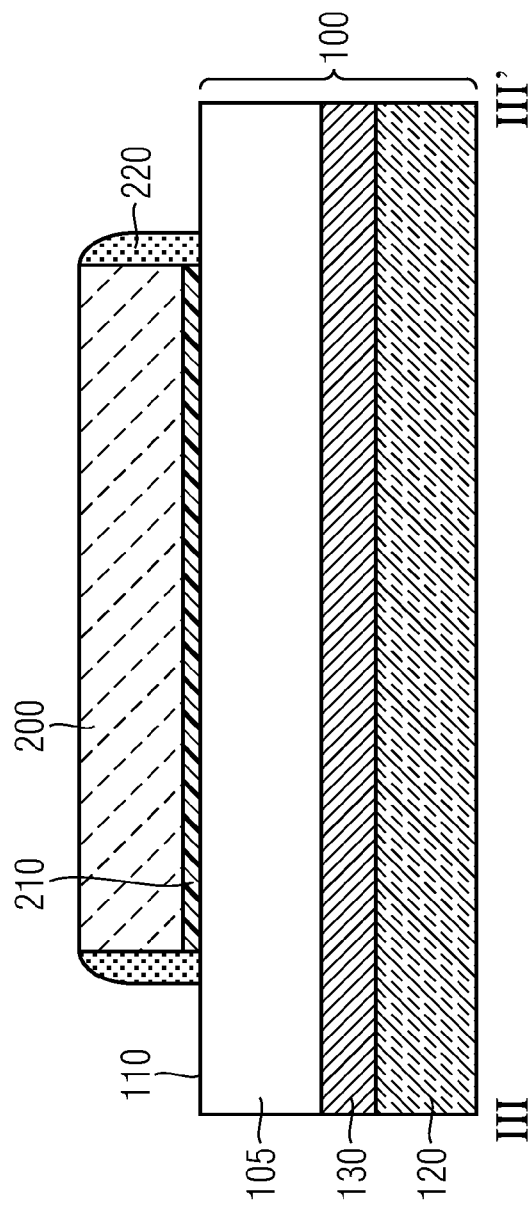
Figure 3F:
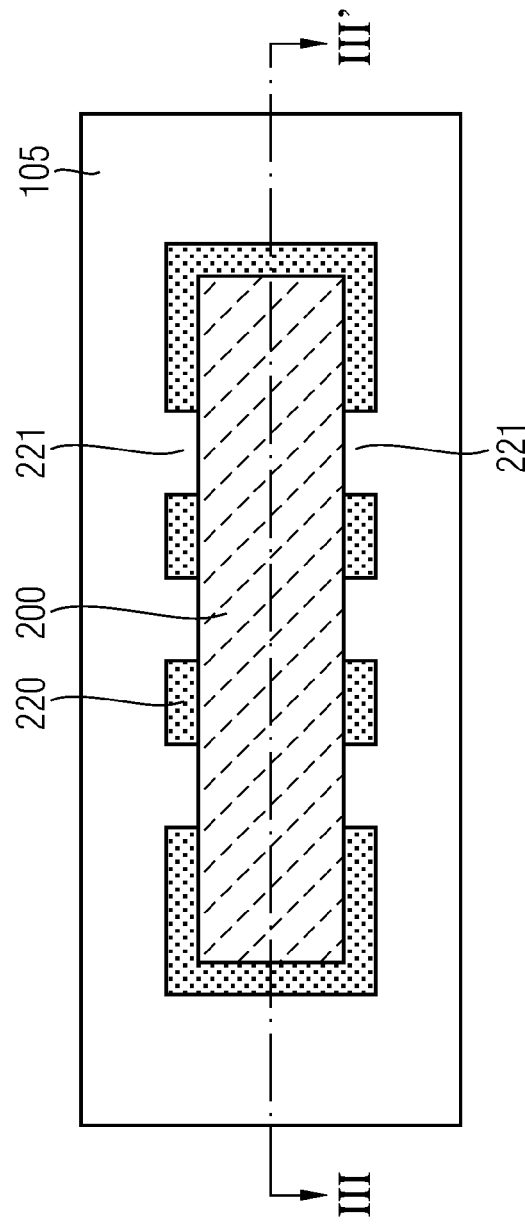

FIG. 3E shows a cross-sectional view of a resulting structure. FIG. 3F shows a plan view of a resulting structure. The cross-sectional view of FIG. 3E is taken between III and III' as is also illustrated in FIG. 3F. Thereafter, portions of the silicon oxide spacer 220 are removed so as to form gaps between adjacent spacer portions 220. As a result, the spacer is segmented along the sidewalls. As is further shown in FIG. 3F, the section of the second semiconductor layer 200 is surrounded by spacers 220, and gaps 221 are disposed between portions of the spacer 220.

Figure 3G:
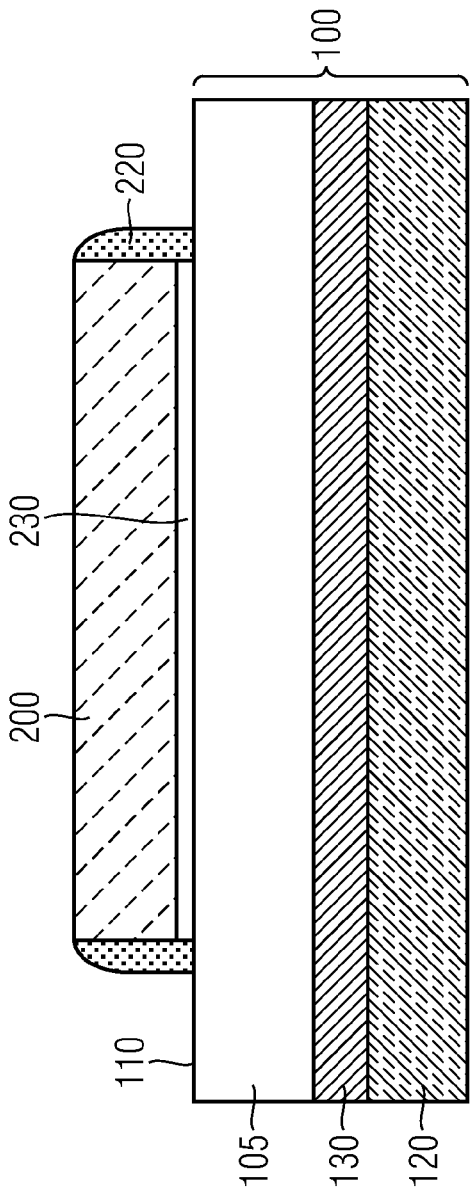

Thereafter, a selective etching step for removing the sacrificial material 210 is performed. For example, a mixture of HF:HNO₃:CH₃COOH may be used for etching SiGe. FIG. 3G shows a cross-sectional view of a resulting structure. As is shown, due to the presence of the gaps 221 between adjacent portions of the spacer 220, the etchant can penetrate to the SiGe layer and etch the SiGe layer. As a result, the SiGe layer is removed between the second layer 200 and the first semiconductor layer 105.

Thereafter, a dielectric layer 230 is formed in the gap 230 between the second semiconductor layer 200 and the first semiconductor layer 105. For example, this may be accomplished by thermal oxidation while providing oxygen. The presence of voids within the dielectric layer 230 does not necessarily degrade the electrical characteristics of the device.

Figure 3H:
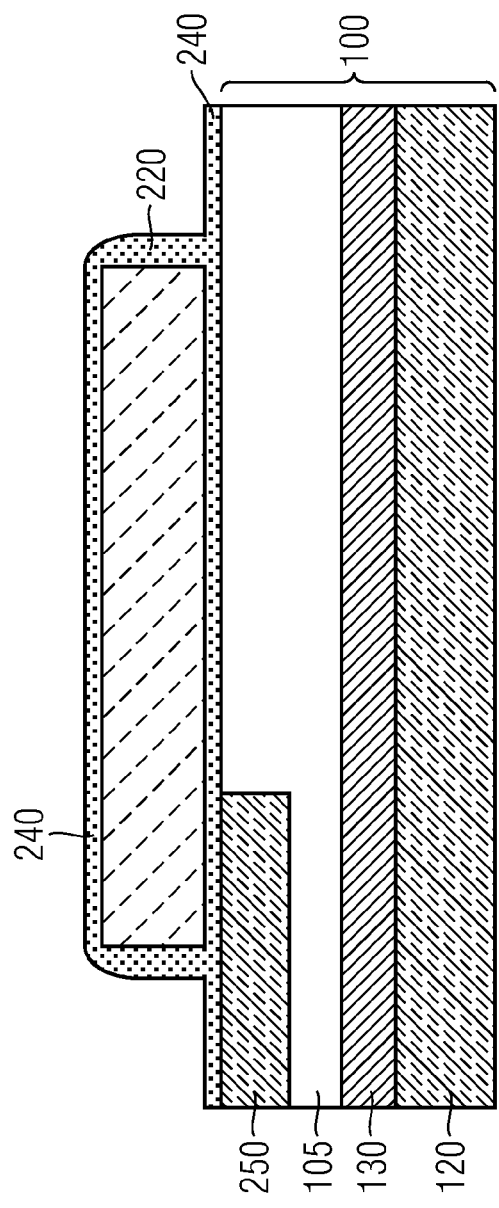

Thereafter, implantation steps are performed for forming the correspondingly doped portions of the semiconductor device. For example, a body implantation portion 250 of the second conductivity type is formed in a portion of the first semiconductor layer 105. FIG. 3H shows an example of a resulting structure. Optionally, the second semiconductor layer 200 may be further patterned so as to provide a dielectric layer 355 between the gate electrode 350 and the drift control region 360.

Figure 3I:
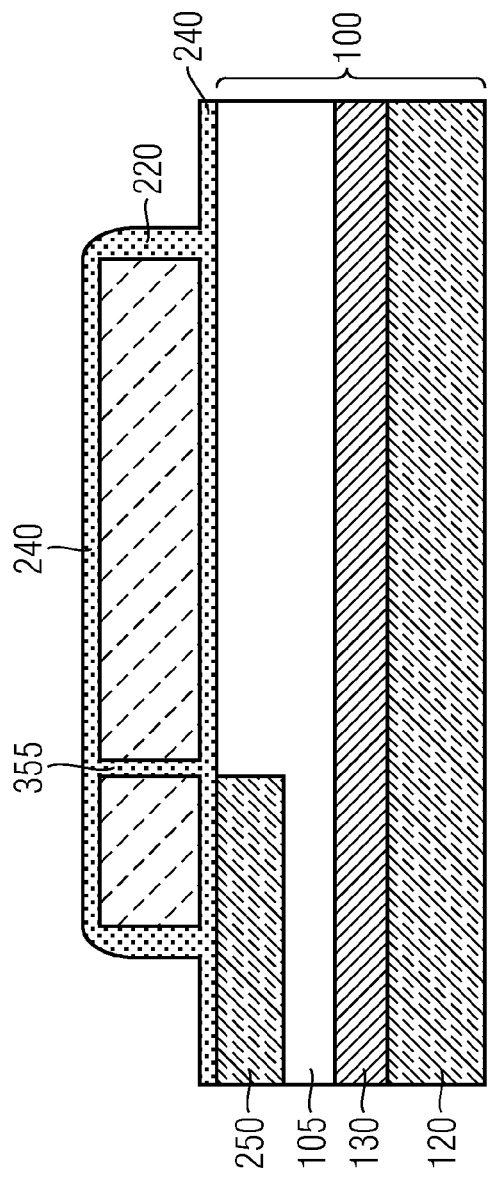

FIG. 3I shows an example of a resulting structure after forming the optional dielectric layer 355. Thereafter, further implantation steps are performed. For example, n⁺ and p⁺ contact implants may be performed, followed by a diffusion step.

Figure 3J:
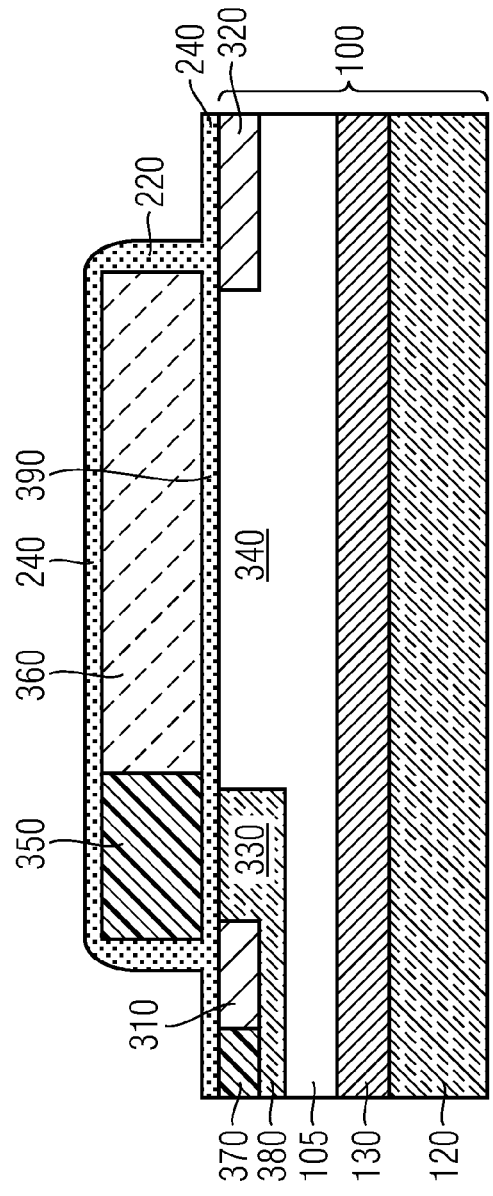

FIG. 3J shows an example of a resulting structure. As is shown, the heavily doped source/drain regions 310, 320 are formed to be disposed adjacent to the first main surface 110. Further, the body contact region 370 is formed by heavily doping with the second conductivity type. Further, the gate electrode 350 is formed by heavily doping the second semiconductor layer with the second conductivity type.

Figure 3K:
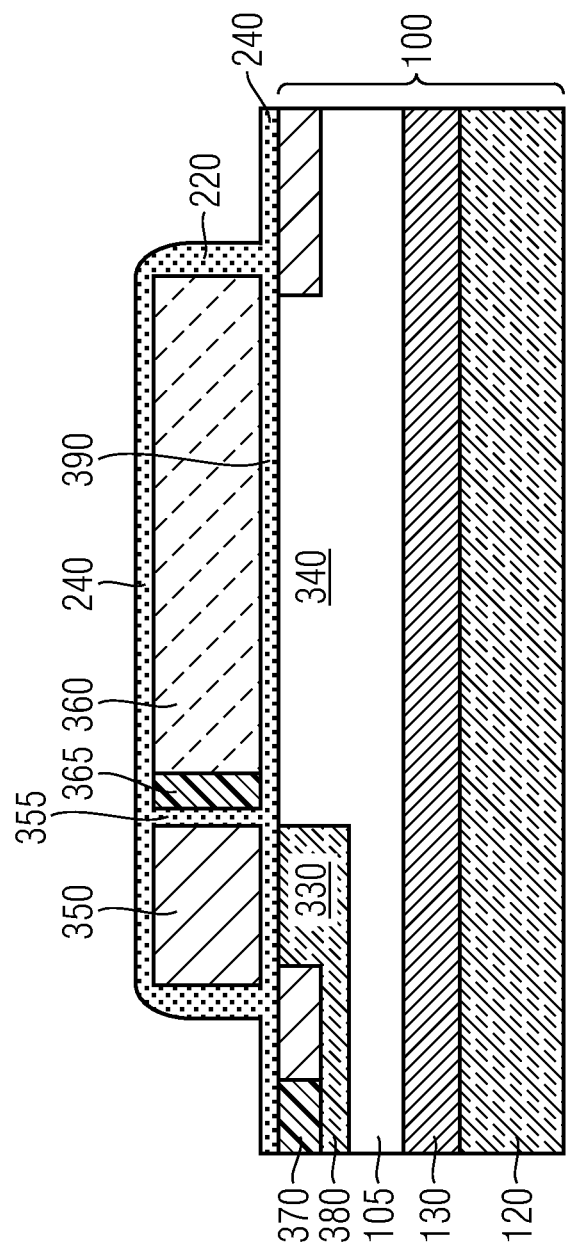

FIG. 3K shows a resulting structure when forming the dielectric layer 355 between the gate electrode 350 and the drift control region. In this case, the gate electrode 350 may be heavily doped with the first conductivity type, and a portion of the drift control region 360 is heavily doped with the second conductivity type to form a contact doped portion 365. Thereafter, optionally, contact openings may be formed and the gate electrode 350 and, optionally, drift control region 360 may be contacted. The method may further comprise forming a portion of the second conductivity type so as to be arranged between the drain region 320 and the drain contact doped portion 325 of the drift control region 360 so as to provide the diode between the drain region 320 and the drift control region 360.

Figure 4:
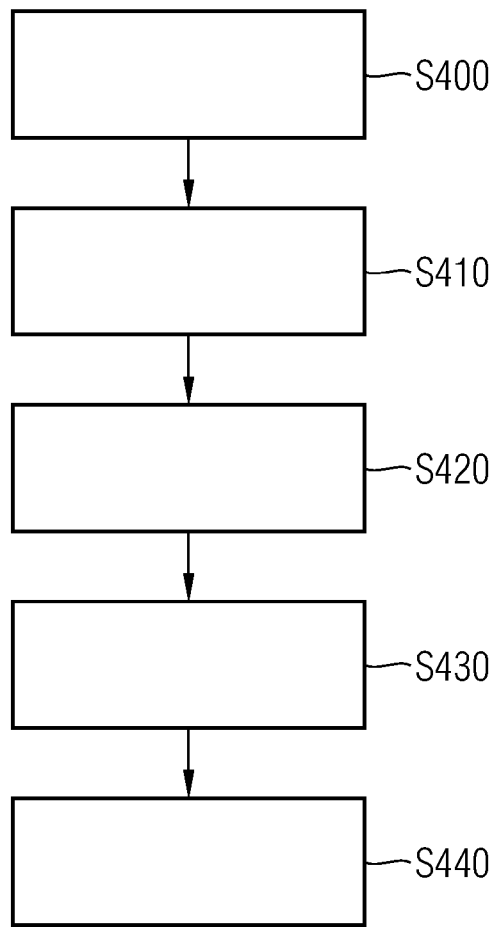
FIG. 4 schematically illustrates a portion of a method of manufacturing a semiconductor device.

Specific processes of the method will be further summarized by referring to FIG. 4. According to an embodiment, a method of manufacturing a semiconductor device specifically comprises forming a first semiconductor layer (S400), forming a sacrificial layer over the first main surface of the first semiconductor layer (S410), a material of the sacrificial layer being different from the material of the first and second semiconductor layers, and epitaxially forming a second semiconductor layer (S420) over the sacrificial layer. The method according to a further embodiment additionally comprises removing the sacrificial layer (S430), and forming a dielectric layer (S440) between the first and the second semiconductor layer.

As has been discussed above, due to the special method of manufacturing the semiconductor device comprising forming a monocrystalline first semiconductor layer, forming a sacrificial layer over the first main surface of the first semiconductor layer and epitaxially forming a second semiconductor layer over the sacrificial layer, followed by replacing the sacrificial layer by a dielectric material, forming the gate electrode and the drift control region in the second semiconductor layer, it is possible to provide a lateral power device that is based on an accumulation region in the drift zone. Due to the special processing method, the power device can be manufacturing by a simple process at low cost. In particular, due to the provision of two planar semiconductor layers that are stacked over each other, the semiconductor device has a simple and robust structure. Due to the special processing method, it is possible to manufacture the semiconductor device as a lateral device. In such a lateral device, during operation the accumulation region is disposed adjacent to the first main surface 110 of the first semiconductor layer 105. Further, contacts to the device may be formed adjacent to the first main surface. Since the semiconductor device is implemented as a lateral device, it may be further integrated with further components of an integrated circuit. The special process methods enables a second monocrystalline layer to be formed over the first monocrystalline layer, a dielectric layer being disposed between the first and the second monocrystalline layer. As a consequence, the components of the semiconductor device may be formed in the first and second monocrystalline layers to provide the desired functionality.

Figure 5:
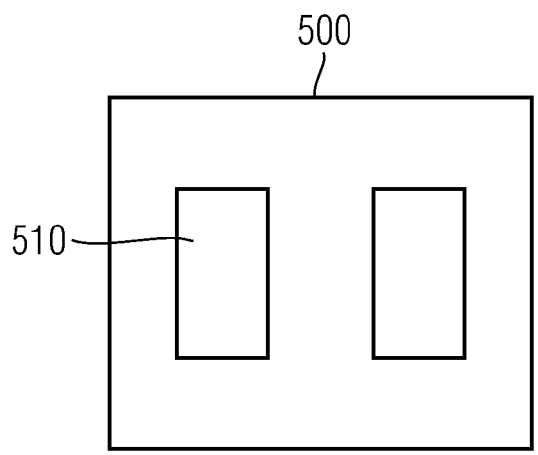
FIG. 5 illustrates an integrated circuit according to an embodiment.

FIG. 5 shows an example of an integrated circuit 500 comprising the semiconductor device 510 according to an embodiment and further integrated components 520. Examples of the further integrated components 520 may comprise switches, bridges and driving circuits. While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor, the transistor comprising:
   a source region;
   a drain region;
   a body region;
   a drift zone; and
   a gate electrode adjacent to the body region,
   wherein the body region, the drift zone, the source region and the drain region are disposed in a first semiconductor layer having a first main surface, the body region and the drift zone are disposed along a first direction between the source region and the drain region, the first direction being parallel to the first main surface;
   the transistor further comprising a drift control region arranged adjacent to the drift zone, the drift control region disposed over the first main surface.

2. The semiconductor device according to claim 1, wherein the gate electrode and the drift control region are disposed in a second semiconductor layer, the second semiconductor layer disposed over the first semiconductor layer.

3. The semiconductor device according to claim 2, wherein the second semiconductor layer comprises a monocrystalline semiconductor material.

4. The semiconductor device according to claim 2, wherein the second semiconductor layer has a smaller length measured in the first direction than the first semiconductor layer.

5. The semiconductor device according to claim 1, further comprising a dielectric layer disposed between the drift region and the drift control region.

6. The semiconductor device according to claim 2, further comprising a spacer made of an insulating material disposed adjacent to sidewalls of the second semiconductor layer.

7. The semiconductor device according to claim 1, wherein the gate electrode is in contact with and electrically coupled to the drift control region.

8. The semiconductor device according to claim 1, wherein the drift control region is doped with dopants of a first conductivity type and the gate electrode is doped with dopants of a second conductivity type.

9. The semiconductor device according to claim 1, further comprising an insulating layer insulating the gate electrode from the drift control region.

10. The semiconductor device according to claim 9, wherein the gate electrode is doped with dopants of a first conductivity type and the drift control region comprises a first portion doped with dopants of a second conductivity type and a second portion doped with dopants of the first conductivity type, the first portion of the drift control region being adjacent to the gate electrode.

11. The semiconductor device according to claim 5, further comprising a gate dielectric layer disposed between the gate electrode and the body region, wherein a thickness of the gate dielectric layer is approximately equal to a thickness of the dielectric layer disposed between the drift region and the drift control region.

12. A semiconductor device comprising a plurality of transistor cells, each of the transistor cells comprising:
 a source region;
 a drain region;
 a body region;
 a drift zone; and
 a gate electrode being adjacent to the body region,
 wherein the body region, the drift zone, the source region and the drain region are disposed in a first semiconductor layer having a first main surface, the body region and the drift zone are disposed along a first direction between the source region and the drain region, the first direction being parallel to the first main surface;
 each of the transistor cells further comprising a drift control region arranged adjacent to the drift zone, the gate electrode and the drift control region disposed in sections of a second semiconductor layer, the second semiconductor layer disposed over the first semiconductor layer, and portions of an insulating layer disposed between adjacent sections of the second semiconductor layer.

13. The semiconductor device according to claim 12, wherein the gate electrode is in contact with and electrically coupled to the drift control region.

14. The semiconductor device according to claim 12, wherein the gate electrode is doped with a first conductivity type and the drift control region is doped with a second conductivity type.

15. The semiconductor device according to claim 12, further comprising an insulating layer insulating the gate electrode from the drift control region.

16. The semiconductor device according to claim 15, wherein the gate electrode is doped with a first conductivity type and the drift control region comprises a first portion doped with a second conductivity type and a second portion doped with the first conductivity type.

17. The semiconductor device according to claim 12, further comprising a dielectric layer disposed between the first semiconductor layer and the second semiconductor layer, wherein a thickness of the dielectric layer in a region adjacent to the gate electrode is equal to a thickness of the dielectric layer in a region adjacent to the drift control region.

18. A method of manufacturing a semiconductor device comprising a transistor, the method comprising:
 forming a source region in a first semiconductor layer having a first main surface;
 forming a drain region in the first semiconductor layer;
 forming a body region in the first semiconductor layer;
 forming a drift zone in the first semiconductor layer; and
 forming a gate electrode so as to be adjacent to the body region,
 wherein forming the body region and the drift zone is accomplished so that the body region and the drift zone are disposed along a first direction between the source region and the drain region, the first direction being parallel to the first main surface;
 the method further comprising forming a drift control region arranged adjacent to the drift zone, the drift control region being formed to be disposed above the first main surface.

19. The method according to claim 18, wherein the gate electrode and the drift control region are formed in a second semiconductor layer, wherein the second semiconductor layer is disposed over the first semiconductor layer.

20. The method according to claim 19, further comprising:
 forming the first semiconductor layer;
 epitaxially forming a sacrificial layer over the first main surface, wherein a material of the sacrificial layer is different from the material of the first and second semiconductor layers; and
 epitaxially forming the second semiconductor layer over the sacrificial layer.

21. The method according to claim 20, further comprising:
 removing the sacrificial layer; and
 forming a dielectric layer between the first and the second semiconductor layer.

22. The method according to claim 19, further comprising patterning the second semiconductor layer so that the second semiconductor layer has a smaller length measured in the first direction than the first semiconductor layer.

23. The method according to claim 19, further comprising forming a spacer adjacent to sidewalls of the second layer.

24. The method according to claim 23, further comprising patterning the spacer to segment the spacer along the sidewalls.

* * * * *